(12) United States Patent
Montgomery

(10) Patent No.: US 8,153,464 B2
(45) Date of Patent: Apr. 10, 2012

(54) WAFER SINGULATION PROCESS

(75) Inventor: Robert Montgomery, South Glamorgan (GB)

(73) Assignee: International Rectifier Corporation, El Segundo, CA (US)

( * ) Notice: Subject to any disclaimer, the term of this patent is extended or adjusted under 35 U.S.C. 154(b) by 538 days.

(21) Appl. No.: 11/582,756

(22) Filed: Oct. 18, 2006

(65) Prior Publication Data

US 2007/0087524 A1 Apr. 19, 2007

Related U.S. Application Data

(60) Provisional application No. 60/727,711, filed on Oct. 18, 2005.

(51) Int. Cl.
*H01L 21/00* (2006.01)
(52) U.S. Cl. .............................. 438/33; 438/68; 438/113
(58) Field of Classification Search .................... 438/33, 438/68, 113
See application file for complete search history.

(56) References Cited

U.S. PATENT DOCUMENTS

| | | | |
|---|---|---|---|
| 4,904,609 A * | 2/1990 | Temple | 438/140 |
| 5,185,292 A * | 2/1993 | VanVonno et al. | 438/59 |
| 5,691,248 A * | 11/1997 | Cronin et al. | 438/109 |
| 6,107,164 A * | 8/2000 | Ohuchi | 438/465 |
| 6,303,462 B1 * | 10/2001 | Gidon | 438/406 |
| 6,306,731 B1 * | 10/2001 | Igarashi et al. | 438/460 |
| 6,365,918 B1 * | 4/2002 | Litwin et al. | 257/77 |
| 6,746,938 B2 * | 6/2004 | Uchiyama et al. | 438/459 |
| 6,809,421 B1 * | 10/2004 | Hayasaka et al. | 257/777 |
| 6,818,475 B2 * | 11/2004 | Yang et al. | 438/113 |
| 6,964,915 B2 * | 11/2005 | Farnworth et al. | 438/460 |
| 7,001,825 B2 * | 2/2006 | Halahan et al. | 438/456 |
| 7,052,977 B1 | 5/2006 | Yegnashankaran et al. | |
| 7,091,109 B2 | 8/2006 | Fujii et al. | |
| 7,291,899 B2 * | 11/2007 | Falck et al. | 257/621 |
| 7,435,620 B2 * | 10/2008 | Benson et al. | 438/108 |
| 7,495,341 B2 * | 2/2009 | Zilber et al. | 257/778 |
| 2003/0003724 A1 * | 1/2003 | Uchiyama et al. | 438/667 |
| 2003/0153125 A1 * | 8/2003 | Ueda et al. | 438/113 |
| 2004/0121514 A1 * | 6/2004 | Yoo et al. | 438/106 |
| 2004/0157410 A1 * | 8/2004 | Yamaguchi | 438/460 |
| 2004/0262732 A1 * | 12/2004 | Noma et al. | 257/685 |
| 2005/0170613 A1 * | 8/2005 | Murata et al. | 438/460 |
| 2005/0208735 A1 * | 9/2005 | Noma et al. | 438/460 |
| 2005/0227415 A1 * | 10/2005 | Farnworth et al. | 438/114 |

(Continued)

FOREIGN PATENT DOCUMENTS

JP 357078151 * 5/1982

*Primary Examiner* — James Mitchell
(74) *Attorney, Agent, or Firm* — Farjami & Farjami LLP

(57) ABSTRACT

A method of singulating a semiconductor die from a wafer is provided. The method includes etching or cutting several trenches into the wafer from a front surface of the wafer, such that each trench extends along an entire side of the die; depositing a passivation layer into the trenches to form a passivation plug on at least a bottom of the trenches to protect the dies and immobilize them during singulation; and forming a rigid carrier layer or plate at the first side of the wafer to secure the dies. The wafer is then ground from the back side to expose the bottom of each trench, a metal layer is formed on the back surface of the wafer; dicing tape is added, the carrier layer is removed, and the die is separated from the wafer by laser cutting or by flexing the tape.

15 Claims, 3 Drawing Sheets

U.S. PATENT DOCUMENTS

| | | | |
|---|---|---|---|
| 2005/0260829 A1* | 11/2005 | Uematsu et al. | 438/460 |
| 2006/0033198 A1* | 2/2006 | Noma et al. | 257/698 |
| 2006/0043535 A1* | 3/2006 | Hiatt | 257/621 |
| 2006/0166498 A1 | 7/2006 | Kirby | 438/667 |
| 2006/0261446 A1* | 11/2006 | Wood et al. | 257/621 |
| 2006/0275949 A1* | 12/2006 | Farnworth et al. | 438/106 |
| 2006/0292877 A1* | 12/2006 | Lake | 438/694 |
| 2008/0237888 A1* | 10/2008 | Hayasaka et al. | 257/777 |
| 2009/0140392 A1* | 6/2009 | Park | 257/620 |

\* cited by examiner

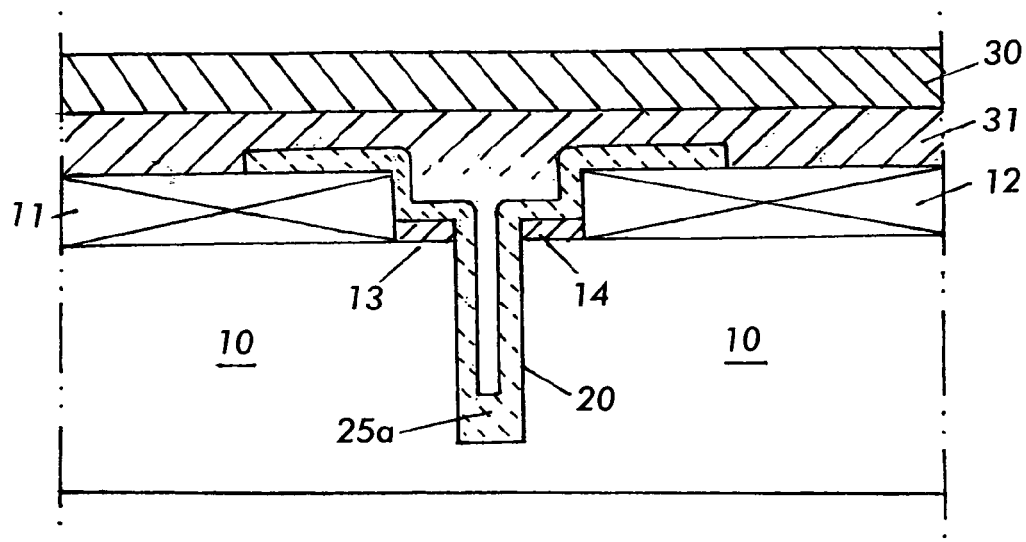
FIG. 4
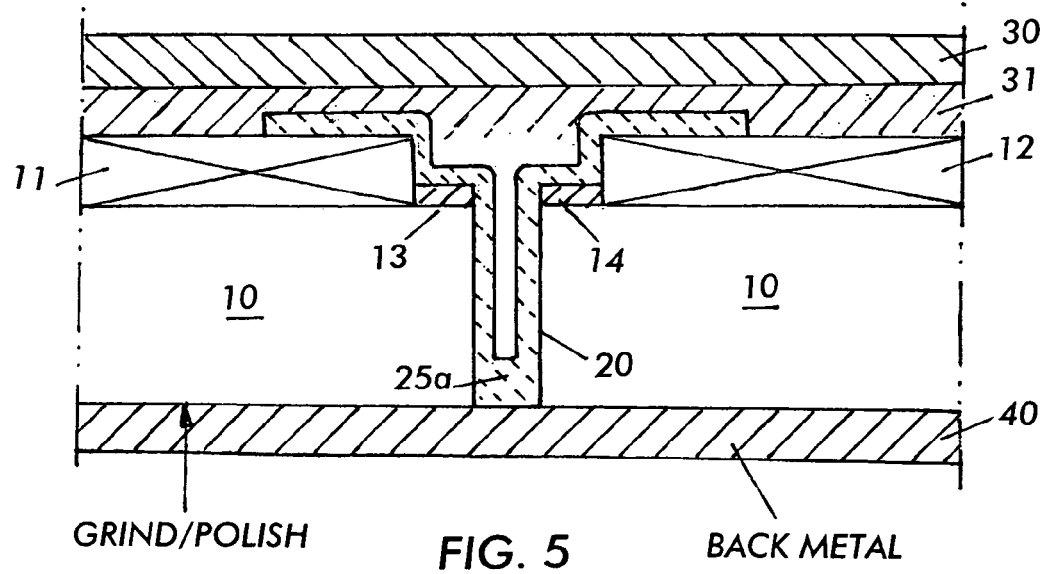
GRIND/POLISH       FIG. 5       BACK METAL

WAFER SINGULATION PROCESS

RELATED APPLICATION

The present application claims priority from U.S. Provisional Application No. 60/727,711, filed Oct. 18, 2005, which is incorporated in full herein by reference.

FIELD OF THE INVENTION

This invention relates to semiconductor device processing and more specifically relates to a novel process for singulating semiconductor dies from a wafer.

BACKGROUND OF THE INVENTION

Semiconductor dies such as diodes, transistors and the like are commonly processed (formed) simultaneously in a large area wafer. Such wafers may be made of monocrystaline silicon or other materials, such as gallium nitride on a suitable substrate such as silicon or the like. After the processing steps are completed, the wafers are singulated, separating the die from the wafer. This "dicing," separation or singulating operation is commonly carried out by sawing through the "streets" between the dies within the wafers.

Singulating the dies of the wafer, for example, by sawing the wafer along the streets after the wafer is complete, including metal layers on the back or front side, can be a time consuming and costly process. Further, the singulation process can damage portions of the dies, including the sides of the dies.

SUMMARY OF THE INVENTION

A method of singulating a semiconductor die from a wafer, including: etching or cutting several trenches into the wafer from a first side, such as a front surface, of the wafer, such that each trench extends through at least a majority of a depth of the wafer along an entire side of the die; depositing a passivation layer into the trenches to form a passivation plug on at least a bottom of the trenches; forming a carrier layer at the first side of the wafer; grinding the wafer from the back side to expose the bottom of each trench before the forming of the metal layer; forming a metal layer on a second side, such as a back surface, of the wafer; removing the carrier layer; and separating the die from the wafer.

Further an adhesive layer may be formed immediately beneath the carrier layer, such that the carrier layer is removed by dissolving or deactivating the adhesive layer.

Also, the metal layer on the second side may be a back metal layer. Dicing tape may be added directly over the metal layer on the second side before the removing of the carrier layer. The die may be separated by flexing the tape and/or by laser cutting the passivation plug.

BRIEF DESCRIPTION OF THE DRAWINGS

FIG. 4 is a sectional schematic illustration of a side view of the wafer with an adhesive layer and a carrier layer added to the first side of the wafer;

FIG. 5 is a sectional schematic illustration of a side view of the wafer with the second side of the wafer having been ground/polished back to expose the bottom of the trench and with a back metal deposited on the second side of the wafer after the grinding/polishing step;

DETAILED DESCRIPTION OF THE INVENTION

A method of singulating the dies of the wafer will now be described with reference to FIGS. 1-6. A silicon wafer 10 has several laterally spaced devices, such as devices 11 and 12 of any desired device type and form necessary for the dies which they comprise. The wafer 10 can be of any desired material, such as silicon, GaN, SiC and the like. Any number of separate devices 11 and 12 can be provided as part of the wafer 10, such as identical vertical conduction MOSFETs with a planar or a trench topology.

Figure 1:
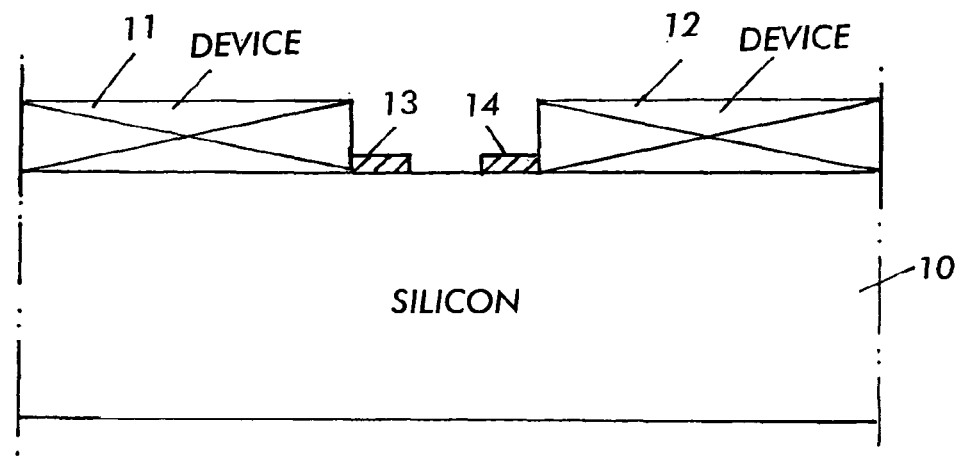
FIG. 1 is a sectional schematic illustration of side view of a portion of a wafer where two dies of the wafer will be separated.
Figure 2:
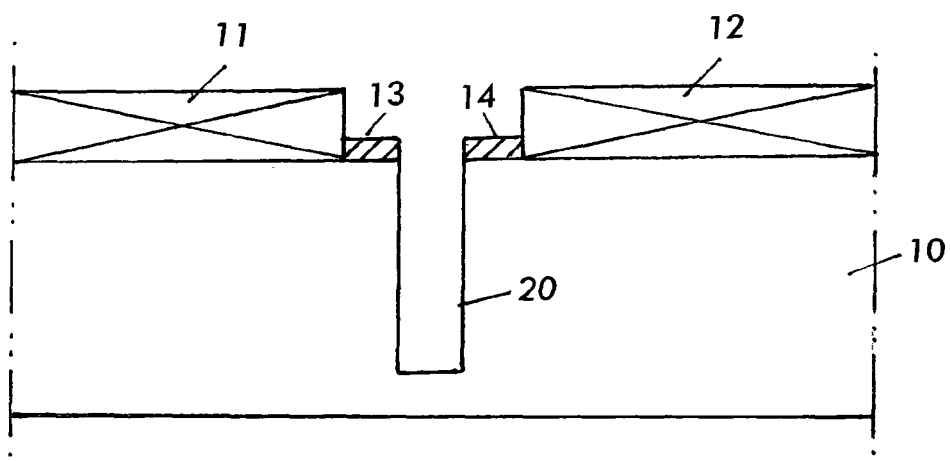
FIG. 2 is a sectional schematic illustration of side view of the wafer with a trench etched or cut at a street in the wafer.

A mask layer is then deposited along the first side of the wafer and a portion of the mask is removed to leave mask deposits 13 and 14, thus exposing the top of the wafer 10 as an etch window so that a trench 20 may be etched. FIG. 2 shows trench mask portions 13 and 14 between devices 11 and 12. Alternatively, the trench may be cut instead of etched. Cutting could be easily performed since a street could be cut along the entire length of the wafer 10 to the desired depth for the trench 20. The trench 20 is formed as shown in FIG. 2 through the majority of the thickness of the wafer 10 or through almost all the entire depth of the wafer 10.

Figure 3:
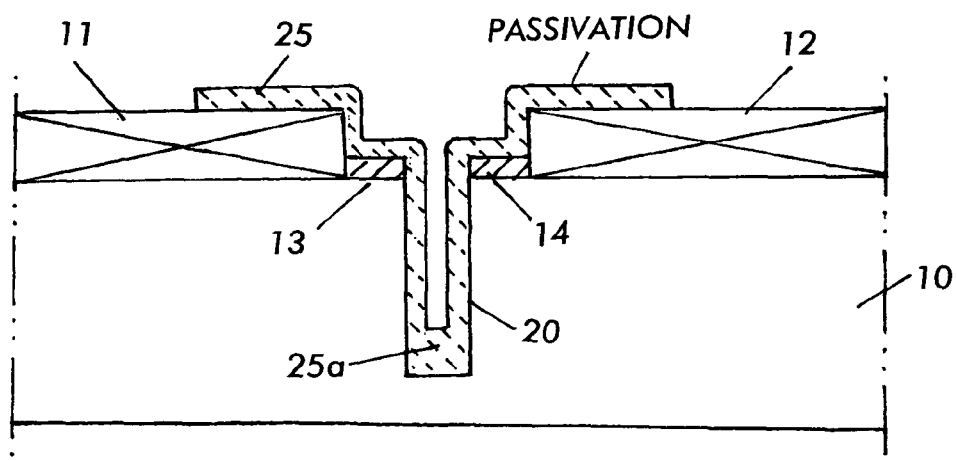
FIG. 3 is a sectional schematic illustration of the side view of the wafer with passivation layer deposited into the trench.

Passivation coating 25 is then applied along the top surface of the wafer as shown in FIG. 3. The passivation coating 25 may comprise a deposited oxide or polyimide-type materials, including for example polyimide monomer films. Coating 25 partially fills the bottom of the trench 20 and forms passivation plug 25A along the entire length and width of the bottom area of each trench.

The passivation plug 25A on or near the bottom of trench 20 protects the dies and the structures of the die, including the sides of the die of the wafer 10 during the grinding and polishing process. Also, passivation plug 25A may aid in stopping the individual dies from moving by providing an additional securing or reinforcing means. The thickness of the passivation plug 25A can be varied depending on the material used for the passivation layer 25, the thickness of the wafer, the radius of the wafer 10, and other such factors.

An adhesive layer 31 of the type that can be dissolved or whose adhesive effect can be neutralized, for example by radiation or by chemical means, may be used to adhere carrier layer 30 to the top surface of the wafer 10, as shown in FIG. 4. The carrier layer 30 may be a rigid plate that secures together the dies of the wafer 10 while the grinding or polishing step at the other surface of the wafer is performed.

With the wafer 10 physically supported or reinforced by the carrier layer 30, as shown in FIG. 5, the second side or the bottom or rear surface of the wafer 10 is ground back and polished to a plane which is at or above the plane of the bottom of the trench 20. Thus, the bottom of the trench 20 is exposed to the second surface of the wafer 10.

As shown in FIG. 5, with the carrier layer 30 still in place and securing or reinforcing the wafer 10, a back metal 40 or the like may be deposited on the bottom surface of the wafer 10. Passivation plug 25 is still in place and additionally secures the dies together and protects the wafer and the walls of the die during the metalization process.

Figure 6:
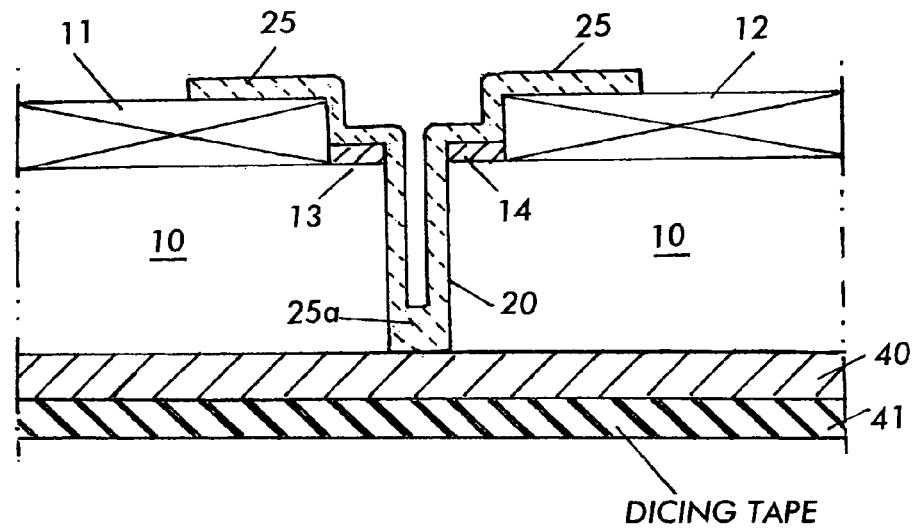
FIG. 6 is a sectional schematic illustration of a side view of the wafer with the dicing tape deposited over the back metal and the adhesive layer and the carrier layer removed from the first side of the wafer.

As shown in FIG. 6, a dicing tape 41 or the like is then attached to the bottom of the back metal 40. Also as shown in FIG. 6, the carrier layer 30 is then removed, for example, by the deactivation of the adhesive layer 31 by radiation or chemical means.

Figure 7:
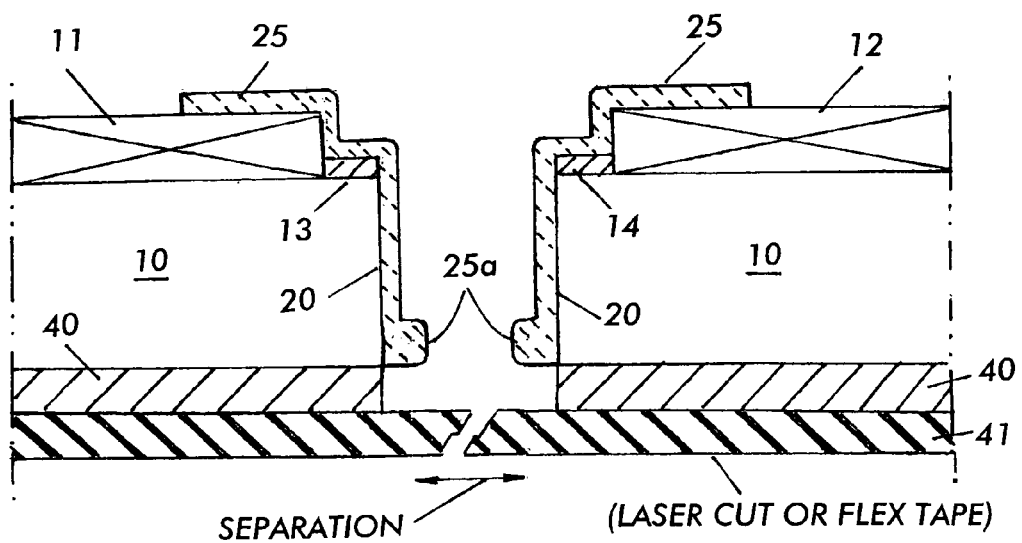
FIG. 7 is a sectional schematic illustration side view of a wafer showing the separation by cutting or flexing of the tape along the trench.

As shown in FIG. 7, the devices 11 and 12 are then singulated or separated by laser cutting through the passivation plug 25A or by flexing the wafer 10 along the street provided by the trench 20, thus leaving the singulated die affixed to the tape 41. The tape 41 is then removed using conventional means.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A method of singulating a semiconductor die from a wafer, the method comprising:
   at least one of etching or cutting a plurality of trenches into the wafer from a first side of the wafer, each trench including opposite sidewalls and extending through at least a majority of a depth of the wafer along an entire side of the die;
   depositing a passivation body into each of the plurality of trenches, each passivation body partially filling a respective trench and including a lining along each of the sidewalls of the respective trench, the linings in each trench being spaced from one another with empty space;
   forming a carrier layer at the first side of the wafer;
   grinding the wafer from the second side to expose the bottom of each trench of the plurality of trenches;
   forming a metal layer on a second side of the wafer;
   removing the carrier layer; and
   separating the die from the wafer.

2. The method of claim 1, wherein the method further comprises forming an adhesive layer immediately beneath the carrier layer, wherein the removing the carrier layer comprises at least one of dissolving or deactivating the adhesive layer.

3. The method of claim 1, wherein the metal layer on the second side comprises a back metal layer.

4. The method of claim 1, wherein the method further comprises adding tape directly over the metal layer on the second side before the removing the carrier layer.

5. The method of claim 4, wherein the separating the die comprises flexing the tape.

6. The method of claim 1, wherein the separating the die comprises laser cutting the passivation body of each of the plurality of trenches.

7. The method of claim 1, wherein the passivation body comprises an oxide.

8. The method of claim 1, wherein the passivation body comprises polyimide.

9. A method of singulating a semiconductor die from a wafer, the method comprising:
   at least one of etching or cutting a plurality of trenches into the wafer from a first side of the wafer, each trench including opposite sidewalls and extending through at least a majority of a depth of the wafer along an entire side of the die;
   depositing a passivation body into each of the plurality of trenches, each passivation body partially filling a respective trench and including a lining along each of the sidewalls of the respective trench, the linings in each trench being spaced from one another with empty space;
   forming an adhesive layer at the first side of the wafer, said adhesive layer filling said empty space of said plurality of trenches;
   forming a carrier layer above the adhesive layer;
   grinding the wafer from the second side to expose the bottom of each trench of the plurality of trenches;
   forming a metal layer on a second side of the wafer;
   removing the carrier layer by dissolving or deactivating the adhesive layer; and
   separating the die from the wafer.

10. The method of claim 9, wherein the metal layer on the second side comprises a back metal layer.

11. The method of claim 9, wherein the method further comprises adding tape directly over the metal layer on the second side before the removing the carrier layer.

12. The method of claim 11, wherein the separating the die comprises flexing the tape.

13. The method of claim 9, wherein the separating the die comprises laser cutting the passivation body of each of the plurality of trenches.

14. The method of claim 9, wherein the passivation body comprises an oxide.

15. The method of claim 9, wherein the passivation body comprises polyimide.

* * * * *